United States Patent
Choi et al.

(10) Patent No.: US 9,640,583 B2
(45) Date of Patent: May 2, 2017

(54) LIGHT EMITTING DEVICE AND LIGHT EMITTING DEVICE ARRAY

(71) Applicant: LG INNOTEK CO., LTD., Seoul (KR)

(72) Inventors: Byung Yeon Choi, Seoul (KR); Hee Young Beom, Seoul (KR); Yong Gyeong Lee, Seoul (KR); Ji Hwan Lee, Seoul (KR); Hyun Seoung Ju, Seoul (KR); Gi Seok Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/962,083

(22) Filed: Dec. 8, 2015

(65) Prior Publication Data

US 2016/0093667 A1    Mar. 31, 2016

Related U.S. Application Data

(63) Continuation of application No. 14/062,131, filed on Oct. 24, 2013, now Pat. No. 9,236,526.

(30) Foreign Application Priority Data

Nov. 5, 2012 (KR) .......................... 10-2012-0124381

(51) Int. Cl.
  *H01L 29/06* (2006.01)
  *H01L 31/00* (2006.01)
  (Continued)

(52) U.S. Cl.
  CPC ............ *H01L 27/156* (2013.01); *H01L 33/06* (2013.01); *H01L 33/10* (2013.01); *H01L 33/145* (2013.01);
  (Continued)

(58) Field of Classification Search
  CPC ........................................................ H01L 33/06
  (Continued)

(56) References Cited

U.S. PATENT DOCUMENTS 6,242,761 B1    6/2001  Fujimoto et al.
2005/0006754 A1 1/2005  Arik et al.
(Continued)

FOREIGN PATENT DOCUMENTS

EP    1 953 838     8/2008
TW    M409542       8/2011
WO    WO 2006/137711  12/2006

OTHER PUBLICATIONS

European Search Report dated Jun. 6, 2014 issued in Application No. 13 191 37.8.
(Continued)

*Primary Examiner* — Igwe U Anya
(74) *Attorney, Agent, or Firm* — Ked & Associates, LLP

(57) ABSTRACT

A light emitting structure includes lower and upper semiconductor layers having different conductive types, and an active layer disposed between the lower and upper semiconductor layers. The light emitting structure is provided on the substrate. A first electrode layer provided on the upper semiconductor layer includes a first adhesive layer and a first bonding layer overlapping each other. A reflective layer is not provided between the first adhesive layer and the first bonding layer.

10 Claims, 15 Drawing Sheets

(51) Int. Cl.
  *H01L 27/15* (2006.01)
  *H01L 33/40* (2010.01)
  *H01L 33/46* (2010.01)
  *H01L 33/10* (2010.01)
  *H01L 33/06* (2010.01)
  *H01L 33/14* (2010.01)
  *H01L 33/62* (2010.01)
  *H01L 33/32* (2010.01)

(52) U.S. Cl.
  CPC .............. *H01L 33/40* (2013.01); *H01L 33/46* (2013.01); *H01L 33/62* (2013.01); *H01L 33/32* (2013.01); *H01L 2924/0002* (2013.01)

(58) Field of Classification Search
  USPC ....................................................... 257/13, 98
  See application file for complete search history.

(56) References Cited

U.S. PATENT DOCUMENTS

| | | |
|---|---|---|
| 2008/0048202 A1 | 2/2008 | Tazima et al. |
| 2008/0219309 A1 | 9/2008 | Hata et al. |
| 2008/0296627 A1* | 12/2008 | Watanabe ........... H01L 21/6835 257/200 |
| 2010/0078656 A1 | 4/2010 | Seo et al. |
| 2010/0096650 A1 | 4/2010 | Ubahara |
| 2011/0089452 A1* | 4/2011 | Jeong .................... H01L 33/405 257/98 |
| 2012/0049232 A1 | 3/2012 | Okabe et al. |
| 2012/0162723 A1 | 6/2012 | Fujii |
| 2012/0267673 A1* | 10/2012 | Okabe .................... H01L 33/40 257/99 |
| 2013/0015425 A1* | 1/2013 | Lin ..................... H01L 33/0079 257/13 |
| 2013/0234192 A1* | 9/2013 | Kim .................... H01L 33/0008 257/98 |

OTHER PUBLICATIONS

U.S. Office Action dated Apr. 2, 2015 issued in U.S. Appl. No. 14/062,131.

Notice of Allowance dated Oct. 2, 2015 issued in U.S. Appl. No. 14/062,131.

* cited by examiner

LIGHT EMITTING DEVICE AND LIGHT EMITTING DEVICE ARRAY

CROSS REFERENCE TO RELATED APPLICATION

The present application is a Continuation of co-pending U.S. patent application Ser. No. 14/062,131 filed on Oct. 24, 2013, which claims priority under 35 U.S.C. §119 to Korean Patent Application No. 10-2012-0124381, filed on Nov. 5, 2012, whose entire disclosures are hereby incorporated by reference.

BACKGROUND

1. Field

Embodiments relate to a light emitting device and a light emitting device array including the same.

2. Background

Red, green and blue light emitting diodes (LEDs) exhibiting high luminance and enabling rendering of white light were developed based on the growth of metal organic chemical vapor deposition and molecular beam epitaxy of gallium nitride (GaN).

Such a light emitting diode (LED) has superior eco-friendliness because it does not contain environmentally harmful substances such as mercury (Hg) used in conventional lighting apparatuses such as incandescent lamps or fluorescent lamps, and serves as an alternative to conventional light sources due to advantages of long lifespan and low power consumption. The key factors in competitiveness of such LEDs are to realize high luminance, based on high-efficiency high-power chips and packaging technologies.

In order to realize high luminance, increase in light extraction efficiency is important. A variety of methods using flip-chip structures, surface texturing, patterned sapphire substrates (PSSs), photonic crystal techniques, anti-reflective layer structures and the like are being researched in order to increase light extraction efficiency.

In general, a light emitting device may include a light emitting structure including a first conductive type semiconductor layer, an active layer and a second conductive type semiconductor layer, a first electrode to supply a first power to the first conductive type semiconductor layer and a second electrode to supply a second power to the second conductive type semiconductor layer which are disposed on the substrate.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
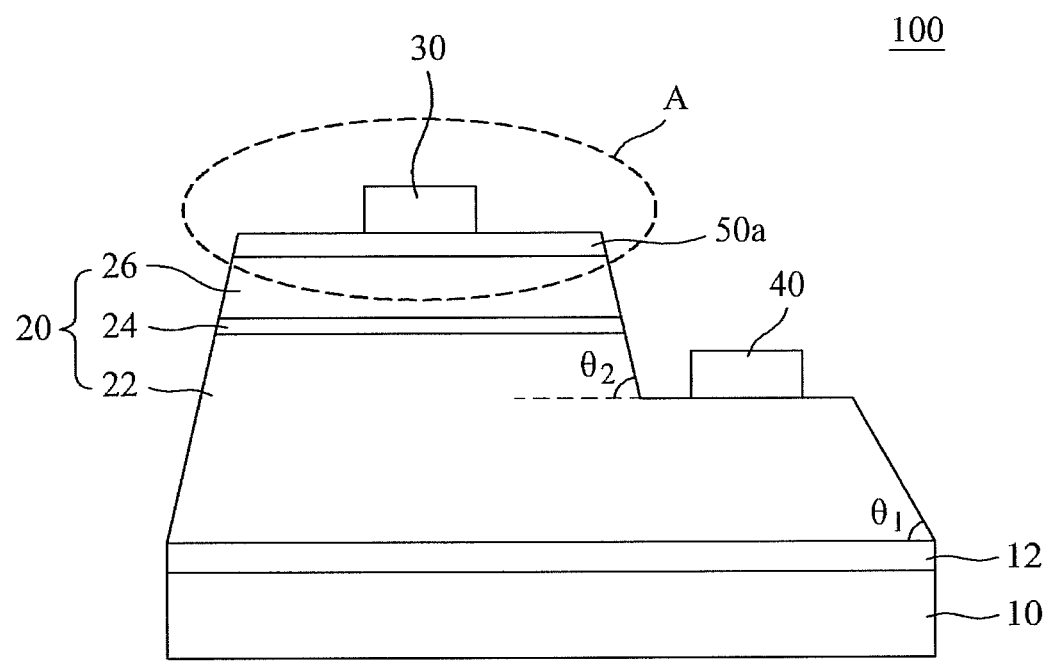
FIG. 1 is a sectional view illustrating a light emitting device according to an embodiment.

Hereinafter, embodiments will be described with reference to the annexed drawings for better understanding. However, the embodiments may be embodied in many different forms and should not be construed as limited to the embodiments set forth herein. Rather, these embodiments are provided so that this disclosure will be thorough and complete, and will fully convey the scope of the disclosure to those skilled in the art.

Prior to description of the embodiments, with regard to description of preferred embodiments, it will be understood that, when one element is referred to as being formed "on" or "under" another element, the one element may be directly formed "on" or "under" the another element, or be indirectly formed "on" or "under" the another element via an intervening element present therebetween. When an element is referred to as being "on" or "under", "under the element" as well as "on the element" may be included based on the element.

In the drawings, the thickness or size of each layer is exaggerated, omitted, or schematically illustrated for convenience of description and clarity. In addition, the size or area of each constituent element does not entirely reflect the actual size thereof.

FIG. 1 is a sectional view illustrating a light emitting device 100 according to an embodiment.

The light emitting device 100 exemplarily shown in FIG. 1 includes a substrate 10, a buffer layer 12, a light emitting structure 20, first and second electrode layers 30 and 40, and a conductive layer 50a.

The substrate 10 may be formed using a carrier wafer suitable for growth of semiconductor materials. In addition, the substrate 10 may be formed of a material having superior thermal conductivity or may be a conductive substrate or an insulating substrate. In addition, the substrate 10 may be formed of a light-transmitting material and may have a mechanical strength which does not cause bending of the overall nitride light emitting structure 20 and enables efficient division into separate chips through scribing and breaking processes. For example, the substrate 10 may contain at least one of sapphire ($Al_2O_3$), GaN, SiC, ZnO, Si, GaP, InP, Ga2O3, GaAs, or Ge. The substrate 10 may be provided at an upper surface thereof with irregularities.

The buffer layer 12 may be disposed between the substrate 10 and the light emitting structure 20 and may be formed using a Group III-V element compound semiconductor. The buffer layer 12 functions to reduce lattice constant mismatch between the substrate 10 and the light emitting structure 20. For example, the buffer layer 12 may contain AlN or undoped nitride, but the disclosure is not limited thereto. The buffer layer 12 may be omitted according to the type of the substrate 10 and the type of the light emitting structure 20.

The light emitting structure 20 includes a lower semiconductor layer 22, an active layer 24 and an upper semiconductor layer 26 disposed on the buffer layer 12 in this order. The lower semiconductor layer 22 and the upper semiconductor layer 26 may have different conductive types.

The lower semiconductor layer 22 may be disposed between the buffer layer 12 and the active layer 24, contain a semiconductor compound, be implemented by a semiconductor compound such as Group III-V or Group II-VI compound and may be doped with a first conductive type dopant. For example, the lower semiconductor layer 22 may contain at least one of a semiconductor material having an empirical formula of $Al_xIn_yGa_{(1-x-y)}N$ ($0 \leq x \leq 1$, $0 \leq y \leq 1$, $0 \leq x+y \leq 1$), InAlGaN, AlGaAs, GaP, GaAs, GaAsP, or AlGaInP. The lower semiconductor layer 22 may be a first conductive type semiconductor layer. When the lower semiconductor layer 22 is an n-type semiconductor layer, the first conductive type dopant may include an n-type dopant such as Si, Ge, Sn, Se or Te. The lower semiconductor layer 22 may have a single or multiple layer structure, but the disclosure is not limited thereto.

The active layer 24 may be disposed between the lower semiconductor layer 22 and the upper semiconductor layer 26 and may have at least one of a single well structure, a double heterostructure, a multiple well structure, a single quantum well structure, a multi quantum well (MQW) structure, a quantum dot structure, or a quantum wire structure. The active layer 24 may be formed to have a pair structure including a well layer and a barrier layer using a Group III-V compound semiconductor material, for example, at least one of InGaN/GaN, InGaN/InGaN, GaN/AlGaN, InAlGaN/GaN, GaAs(InGaAs)/AlGaAs, or GaP (InGaP)/AlGaP, but the disclosure is not limited thereto. The well layer may be formed of a material having a smaller energy band gap than an energy band gap of the barrier layer.

The upper semiconductor layer 26 may be disposed on the active layer 24 and contain a semiconductor compound. The upper semiconductor layer 26 may be implemented by a Group III-V or Group II-VI compound semiconductor or the like, for example, at least one of a semiconductor material having an empirical formula of $In_xAl_yGa_{1-x-y}N$ ($0 \leq x \leq 1$, $0 \leq y \leq 1$, $0 \leq x+y \leq 1$), AlInN, AlGaAs, GaP, GaAs, GaAsP, or AlGaInP.

Unlike the lower semiconductor layer 22 which is the first conductive type semiconductor layer, the upper semiconductor layer 26 may be a second conductive type semiconductor layer and be doped with a second conductive type dopant. When the upper semiconductor layer 26 is a p-type semiconductor layer, the second conductive type dopant may be a p-type dopant such as Mg, Zn, Ca, Sr, or Ba. The upper semiconductor layer 26 may have a single or multiple layer structure, but the disclosure is not limited thereto.

The lower semiconductor layer 22 may be implemented by an n-type semiconductor layer and the upper semiconductor layer 26 may be implemented by a p-type semiconductor layer. Accordingly, the light emitting structure 20 may include at least one of n-p, p-n, n-p-n, or p-n-p junction structures. Meanwhile, the first electrode layer 30 is disposed on the upper semiconductor layer 26 and the second electrode layer 40 is disposed on the lower semiconductor layer 22. In order to dispose the second electrode layer 40 on the lower semiconductor layer 22, the light emitting structure 20 may expose a part of the lower semiconductor layer 22. That is, a part of the lower semiconductor layer 22 may be exposed by etching parts of the upper semiconductor layer 26, the active layer 24 and the lower semiconductor layer 22 through mesa etching. In this case, an exposed surface of the lower semiconductor layer 22 may be disposed lower than the lower surface of the active layer 24.

FIGS. 2A to 2F are views illustrating embodiments of part "A" of FIG. 1.

Figure 2A:
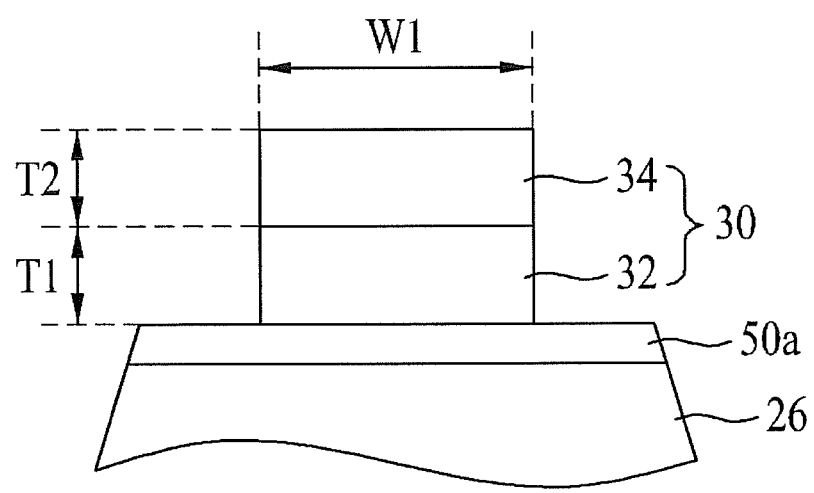
FIGS. 2A to 2F are views illustrating embodiments of part "A" of FIG. 1.

Referring to FIG. 2A, the first electrode layer 30 according to an embodiment may include a first adhesive layer 32 and a first bonding layer 34 which overlap with each other. That is, the first adhesive layer 32 is disposed on the upper semiconductor layer 26 and the first bonding layer 34 is disposed on the first adhesive layer 32. In this case, a reflective layer is not interposed between the first adhesive layer 32 and the first bonding layer 34. That is, the first electrode layer 30 does not include a reflective layer.

The first adhesive layer 32 may contain a material which ohmic-contacts the upper semiconductor layer 26. For example, the first adhesive layer 32 may be formed with a single or multilayer structure using at least one material of Cr, Rd, or Ti. In addition, a thickness (T1) of the first adhesive layer 32 may be at least 5 nm to 15 nm. For example, when the thickness (T1) of the first adhesive layer 32 is less than 2 nm, adhesive strength may be deteriorated and when the thickness (T1) exceeds 15 nm, electric resistance may be increased. Accordingly, the thickness (T1) of the first adhesive layer 32 may be 2 nm to 10 μm.

In addition, the first bonding layer 34 may be disposed such that the first bonding layer 34 contacts the first adhesive layer 32. When a first barrier layer 36 is disposed between the first bonding layer 34 and the first adhesive layer 32, as described below, the first bonding layer 34 may be disposed in an upper part of the first adhesive layer 32, instead of contacting the first adhesive layer 32. The first bonding layer 34 may contain Au. For example, when a thickness (T2) of the first bonding layer 34 is less than 100 nm, it may be difficult to perform wire bonding, and when the thickness (T2) exceeds 2,000 nm, conductive efficiency may be insufficient in consideration of high cost of Au. Accordingly, the thickness (T2) of the first bonding layer 34 may be 100 nm to 2,000 nm, for example, 140 nm.

When a width W1 of the first electrode layer 30 is smaller than 1 μm, it is difficult to implement the first electrode layer 30, and when the width W1 exceeds 100 μm, the first electrode layer 30 absorbs light, thus deteriorating light extraction efficiency. Accordingly, the width W1 of the first electrode layer 30 may be 1 μm to 100 μm, for example, 5 μm to 100 μm.

Figure 2B:
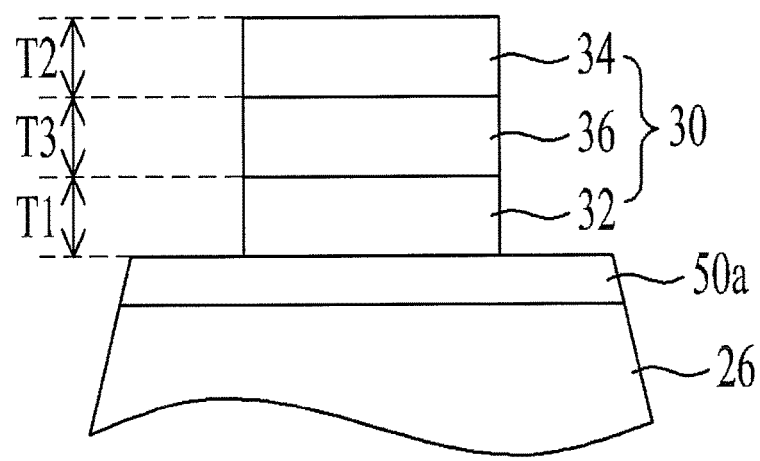

In another embodiment, as exemplarily shown in FIG. 2B, the first electrode layer 30 may further include a first barrier layer 36 disposed between the first adhesive layer 32 and the first bonding layer 34. The first barrier layer 36 may be disposed so as to contact both the first adhesive layer 32 and the first bonding layer 34.

The first barrier layer 36 may be formed of one or multiple layers using at least one material of Ni, Cr, Ti, or Pt. For example, the first barrier layer 36 may be formed of an alloy of Cr and Pt. In addition, the first barrier layer 36 may have a thickness (T3) of 200 nm to 300 nm, for example, 250 nm.

The second electrode layer 40 disposed on the lower semiconductor layer 22 shown in FIG. 1 may include a second adhesive layer and a second bonding layer which overlap each other. The second adhesive layer may be formed to have a single or multilayer structure using at least one material of Cr, Rd, or Ti, and the second bonding layer may contain Au.

The second adhesive layer and the second bonding layer may have the same structure and material as those of the first adhesive layer 32 and the second bonding layer 34, respectively, but the disclosure is not limited thereto. That is, as in the first electrode layer 30, the second electrode layer 40 may have a structure in which the reflective layer is not disposed between the second adhesive layer and the second bonding layer, but may have a structure in which a reflective layer is disposed between the second adhesive layer and the second bonding layer. In addition, the second electrode layer 40 may have different configuration and material from those of the first electrode layer 30. That is, the second electrode layer 40 may include the second adhesive layer and the second bonding layer, and the first electrode layer 30 may include the first adhesive layer 32, the first barrier layer 36 and the first bonding layer 34.

In addition, the second electrode layer 40 may further include a second barrier layer disposed between the second adhesive layer and the second bonding layer. The second barrier layer may be disposed such that it contacts both the second adhesive layer and the second bonding layer. The second barrier layer may be formed to have a single or multilayer structure using a material containing at least one of Ni, Cr, Ti, or Pt.

The second barrier layer may be formed of the same material as the first barrier layer 36, but the disclosure is not limited thereto. That is, the second barrier layer may be disposed between the second adhesive layer and the second bonding layer, as shown in FIG. 2B, may have the same configuration as the configuration in which the first barrier layer 36 is interposed between the first adhesive layer 32 and the first bonding layer 36. Alternatively, the second barrier layer may have a different thickness and material from those of the first barrier layer 36.

For example, the second electrode layer 40 may include the second adhesive layer, the second barrier layer and the second bonding layer, and the first electrode layer 30 may include the first adhesive layer 32 and the first bonding layer 34.

In addition, as shown in FIG. 1, a side surface of the lower semiconductor layer 22 may be inclined at an inclination angle ($\theta 1$) with respect to the substrate 10, and a side surface of the lower semiconductor layer 22 adjacent to the exposed lower semiconductor layer 22 may be inclined at an inclination angle ($\theta 2$) with respect to the substrate 10. The inclination angles ($\theta 1$ and $\theta 2$) may be 30° to 80°. As such, when a side surface of the lower semiconductor layer 22 is inclined, extraction efficiency of light emitted from the active layer 24 may be improved. However, when the inclination angles ($\theta 1$ and $\theta 2$) are less than 30°, an area of the active layer 24 may be decreased and luminous efficacy may thus be deteriorated, and when the inclination angles exceed 80°, light extraction efficiency may not be obtained. Accordingly, the inclination angles ($\theta 1$ and $\theta 2$) may be 30° to 80°, for example, 70°.

When a reflective layer is disposed between the first adhesive layer 32 and the first barrier layer 36, the reflective layer reflects light emitted from the active layer 24 and thereby reduces dose of light absorbed by the metal of the first electrode layer 30. However, when the reflective layer is disposed between the first adhesive layer 32 and the first barrier layer 36, there is a problem in that the first bonding layer 34 made of Au and the reflective layer made of Al are inter-diffused via the first barrier layer 36 made of Ni interposed therebetween.

In addition, in order to obtain sufficient reflectivity, the reflective layer may commonly have a thickness of 50 nm to 300 nm. Due to presence of this thick reflective layer, the first adhesive layer 32 is formed to a small thickness of, for example, less than 2 nm, thus reducing adhesive strength between the first electrode layer 30 and the light emitting structure 20.

However, in the present embodiment, the reflective layer is not disposed between the first adhesive layer 32 and the first bonding layer 34. In addition, the reflective layer is not disposed between the second adhesive layer and the second bonding layer. Accordingly, the first adhesive layer 32 may be formed to a great thickness, corresponding to the thickness of the reflective layer, thus improving adhesive strength between the first electrode layer 30 and the light emitting structure 20 and eliminating the risk of inter-diffusion between the reflective layer and the first bonding layer 34. Accordingly, as described above, in the present embodiment, the first adhesive layer 32 may have a great thickness (T1) of 2 nm or more.

In addition, as shown in FIG. 1, the light emitting device may further include a conductive layer 50a disposed between the upper semiconductor layer 26 and the first electrode layer 30. The conductive layer 50a of FIG. 1 is disposed on the upper semiconductor layer 26, but the disclosure is not limited thereto and the conductive layer 50a may be disposed in various arrangements. For example, referring to FIGS. 2C and 2D, the conductive layer 50b may be disposed such that it surrounds an upper part and a side part of the current blocking layer 60.

The conductive layers 50a and 50b reduce total reflection and exhibit superior light transmittance, thus increasing extraction efficiency of light emitted from the active layer 24 to the upper semiconductor layer 26. The conductive layers 50a and 50b may be implemented by a single or multilayer structure using a transparent oxide-based material having high transmittance at visible light emission wavelengths, for example, at least one of indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), IrOx, RuOx, RuOx/ITO, Ni, Ag, Au, Ni/IrOx/Au, or Ni/IrOx/Au/ITO.

In addition, the light emitting device according to the present embodiment, as exemplarily shown in FIGS. 2C to 2F, may further include a current blocking layer 60 disposed between the first electrode layer 30 and the upper semiconductor layer 26. The current blocking layer 60 enables efficient diffusion of carriers directed to the active layer 24 from the first electrode layer 30 and contributes to improvement of luminous intensity of the active layer 24.

The current blocking layer 60 may be formed of a material such as silicon oxide ($SiO2$) or may have a cavity filled with air. Alternatively, as exemplarily shown in FIG. 2C, the current blocking layer 60 may be implemented by a distributed Bragg reflector (DBR, hereinafter, referred to as a "first distributed Bragg reflector"; 60a or 60b). The distributed Bragg reflector means two or more insulating layers having different refractive indexes which are alternately laminated so as to improve reflectivity. The first distributed Bragg reflectors 60a and 60b exemplarily shown in FIG. 2C function both as the reflective layer not disposed between the first adhesive layer 32 and the first bonding layer 34, and as the current blocking layer 60. The first distributed Bragg reflectors 60a and 60b can more efficiently perform the function of the reflective layer since they have a reflectivity of, for example, 98%, higher than a reflectivity of 90% or less of the reflective layer.

Figure 2C:
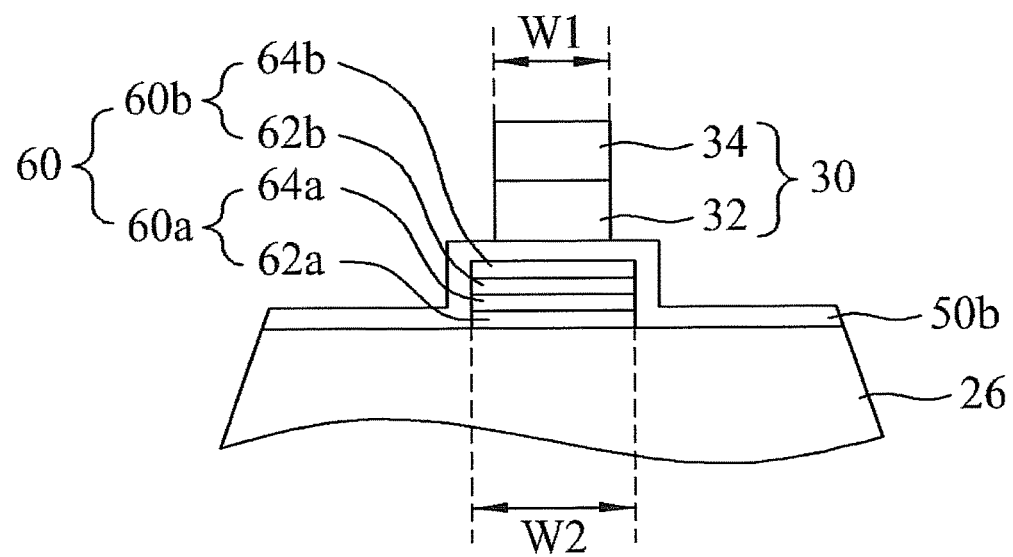
Figure 2D:
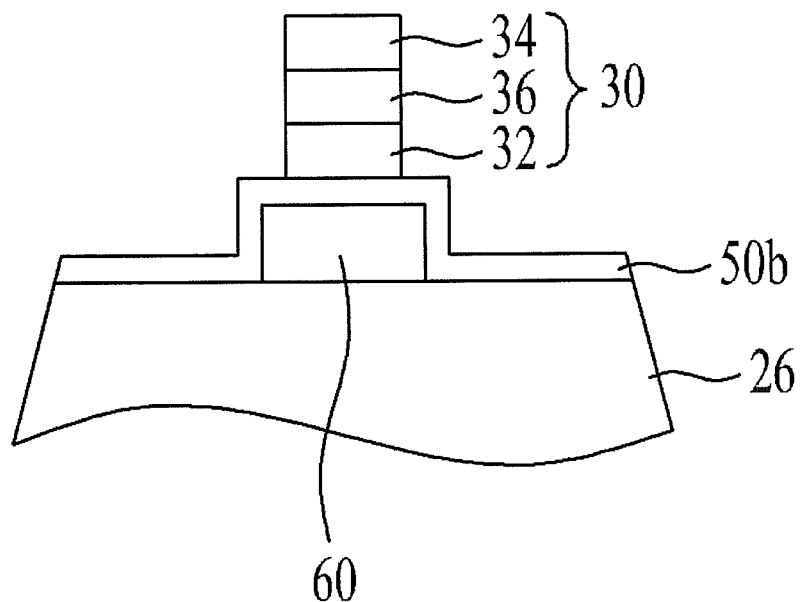
Figure 2E:
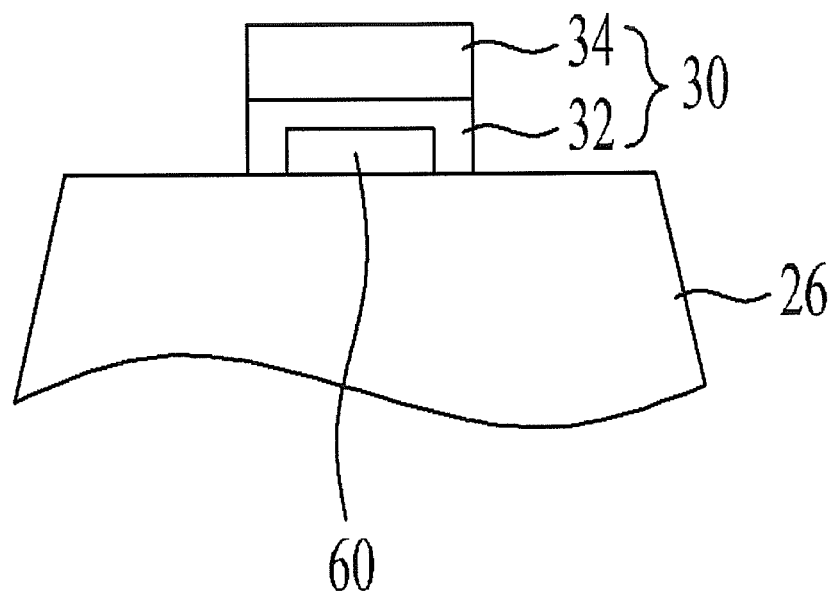
Figure 2F:
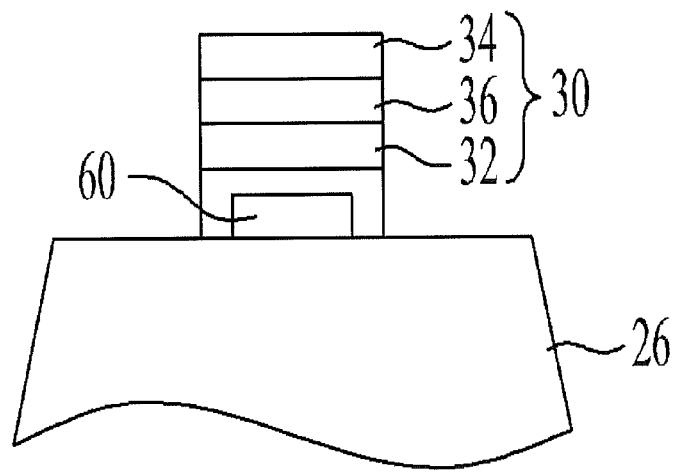

As shown in FIG. 2C, a first layer 62a or 62b and a second layer 64a or 64b with different refractive indexes are alternately laminated twice, but the first and second layers may be laminated times more than twice.

The first layer 62a or 62b is a low refractive index layer and for example includes silicon oxide (SiO2) having a refractive index of 1.4 or aluminum oxide (Al2O3) having a refractive index of 1.6. In addition, the second layer 64a or 64b is a high refractive index layer and for example includes silicon nitride (Si3N4) having a refractive index of 2.05 to 2.25, titanium nitride (TiO2) having a refractive index of 2 or more, or Si—H having a refractive index of 3 or more.

In addition, in the first distributed Bragg reflector 60a or 60b, each of the first layer 62a or 62b, and the second layer 64a or 64b may have a thickness of $\lambda/(4n)$. Here, $\lambda$ represents a wavelength of light emitted from the active layer 24 and n represents a refractive index of the corresponding layer.

Referring to FIG. 2C, the width W2 of the current blocking layer 60 implemented by DBR may be 1 to 10 fold the width W1 of the first electrode layer 30.

Hereinafter, a semiconductor device array which emits light using a plurality of light emitting devices each of which corresponds to the light emitting device described above will be described with reference to the annexed drawings.

Figure 3:
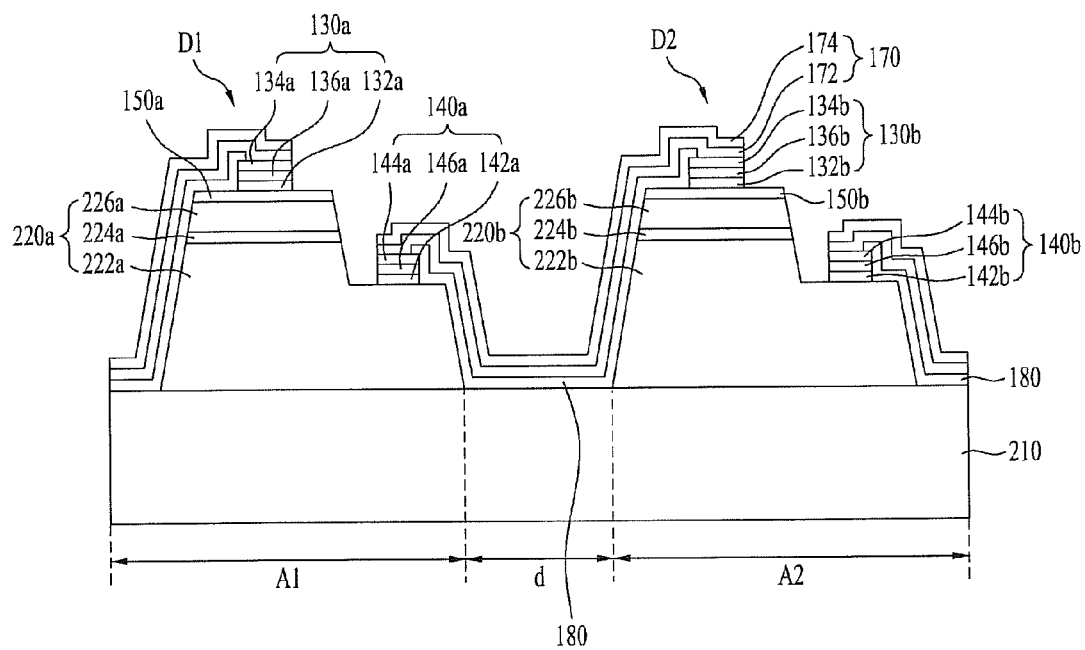
FIG. 3 is a sectional view illustrating a light emitting device array using the light emitting device according to the embodiment.

FIG. 3 is a sectional view illustrating a light emitting device array 200A using the light emitting device according to the embodiment.

The light emitting device array 200A exemplarily shown in FIG. 3 includes a substrate 210, a plurality of light emitting devices D1 and D2, a conductive interconnection layer 170 and a first insulating layer 180.

The substrate 210 may be formed using a carrier wafer suitable for growth of semiconductor materials. In addition, the substrate 10 may be formed of a material having superior thermal conductivity or may be a conductive substrate or an insulating substrate. In addition, the substrate 210 may be formed of a light-transmitting material and may have a mechanical strength which does not cause bending of the overall nitride light emitting structures 220a and 220b of the light emitting devices D1 and D2. For example, the substrate 210 may contain at least one of sapphire ($Al_2O_3$), GaN, SiC, ZnO, Si, GaP, InP, $Ga_2O_3$, GaAs, or Ge. The substrate 210 may be provided at an upper surface thereof with irregularities.

The plurality of light emitting devices (for example, D1 and D2) may be spaced from one another in a horizontal direction on the substrate 210. As shown in FIG. 3, only two light emitting devices D1 and D2 are shown for convenience of description, but more than two light emitting devices may be disposed in the form shown in FIG. 3 on the substrate 210.

Each of the plurality of light emitting devices D1 and D2 has a structure exemplarily shown in FIG. 1. That is, the first light emitting device D1 includes a light emitting structure 220a, a first electrode layer 130a and a second electrode layer 140a, and the second light emitting device D2 includes a light emitting structure 220b, a first electrode layer 130b and a second electrode layer 140b. The light emitting structure 220a or 220b is the same as the light emitting structure 20 exemplarily shown in FIG. 1. That is, the light emitting structure 220a includes lower and upper semiconductor layers 222a and 226a having different conductive types and an active layer 224a disposed between the lower and upper semiconductor layers 222a and 226a, and the light emitting structure 220b includes lower and upper semiconductor layers 222b and 226b having different conductive types and an active layer 224b disposed between the lower and upper semiconductor layers 222b and 226b. The lower semiconductor layer 222a or 222b, the active layer 224a or 224b and the upper semiconductor layer 226a or 226b are the same as the lower semiconductor layer 22, the active layer 24 and the upper semiconductor layer 26 exemplarily shown in FIG. 1, respectively. Accordingly, a detailed explanation thereof is omitted.

In addition, the first electrode layers 130a and 130b are disposed on the upper semiconductor layers 226a and 226b, respectively, and the second electrode layers 140a and 140b are disposed on the lower semiconductor layers 222a and 222b, respectively.

The first electrode layers 130a and 130b include first adhesive layers 132a and 132b, first barrier layers 136a and 136b and first bonding layers 134a and 134b, respectively. The second electrode layers 140a and 140b include second adhesive layers 142a and 142b, second barrier layers 146a and 146b and second bonding layers 144a and 144b, respectively. The first adhesive layers 132a and 132b, the first barrier layers 136a and 136b, and first bonding layers 134a and 134b correspond to the first adhesive layer 32, the first barrier layer 36 and the first bonding layer 34 exemplarily shown in FIG. 1, respectively. The second adhesive layers 142a and 142b, the second barrier layers 146a and 146b, and the second bonding layers 144a and 144b correspond to the second adhesive layer, the second barrier layer and the second bonding layer of the second electrode layer 40 exemplarily shown in FIG. 1. That is, in the first electrode layers 130a and 130b, the reflective layer is not interposed between the first adhesive layer 132a or 132b and the first bonding layer 134a or 134b. In the second electrode layers 140a and 140b, a reflective layer is not interposed between the second adhesive layer 142a or 142b, and the first bonding layer 144a or 144b. Furthermore, the first electrode layers 130a and 130b, and the second electrode layers 140a and 140b are the same as the first electrode layer 30 and the second electrode layer 40 exemplarily shown in FIG. 1, respectively. Accordingly, a detailed explanation thereof is omitted.

Hereinafter, for convenience of description, the first electrode layers 130a and 130b include the first adhesive layers 132a and 132b, the first barrier layers 136a and 136b, and the first bonding layers 134a and 134b, respectively, and the second electrode layers 140a and 140b include second adhesive layers 142a and 142b, second barrier layers 146a and 146b, and second bonding layers 144a and 144b, respectively. However, the following description may be equally applied to the cases in which the first electrode layers 130a and 130b include only the first adhesive layers 132a and 132b, and the first bonding layers 134a and 134b, respectively, and in which the second electrode layers 140a and 140b include only the second adhesive layers 142a and 142b, and the second bonding layers 144a and 144b.

The light emitting device D1 or D2 of FIG. 3 may further include the conductive layer 150a or 150b interposed between the light emitting structure 220a or 220b, and the first electrode layer 130a or 130b. The conductive layer 150a or 150b of FIG. 3 corresponds to the conductive layer 50a of FIG. 1 and a detailed explanation thereof is thus omitted.

One light emitting device D1 exemplarily shown in FIG. 3 is disposed in the first region A1 on the substrate 210 and the other light emitting device D2 is disposed in the second region A2 on the substrate 210. The light emitting devices D1 and D2 are spaced from each other by a predetermined distance (d). For example, the distance (d) is 2 μm to 7 μm, for example, 5 μm.

The light emitting device array 200A of FIG. 3 further includes a first insulating layer 180. The first insulating layer 180 is disposed between a plurality of light emitting devices D1 and D2, and the conductive interconnection layer 170 and functions to electrically isolate the light emitting devices D1 and D2 from the conductive interconnection layer 170.

Meanwhile, the conductive interconnection layer 170 functions to connect two adjacent light emitting devices (for example, D1 and D2) among the plurality of light emitting devices. That is, the conductive interconnection layer 170 functions to electrically connect the first electrode layer 130b of one (D2) of two light emitting devices D1 and D2, to the second electrode layer 140a of the other (D1) of two light emitting devices D1 and D2. As shown in FIG. 3, the two light emitting devices D1 and D2 may be electrically connected in serial via the conductive interconnection layer 170, but the disclosure is not limited thereto. That is, the light emitting devices D1 and D2 may be electrically connected in parallel via the conductive interconnection layer 170.

The conductive interconnection layer 170 includes a third adhesive layer 172 and a third bonding layer 174 which overlap each other, and a reflective layer is not interposed between the third adhesive layer 172 and the third bonding layer 174. The third adhesive layer 172 may be formed to have a single or multilayer structure using at least one material of Cr, Rd, or Ti, and the third bonding layer 174 contains Au.

The third adhesive layer 172 and the third bonding layer 174 may have the same configurations and materials as the first adhesive layer 32 and the first bonding layer 34 shown in FIG. 1, respectively, or may have different configurations and materials as those of the first adhesive layer 32 and the first bonding layer 34, respectively.

Figure 4:
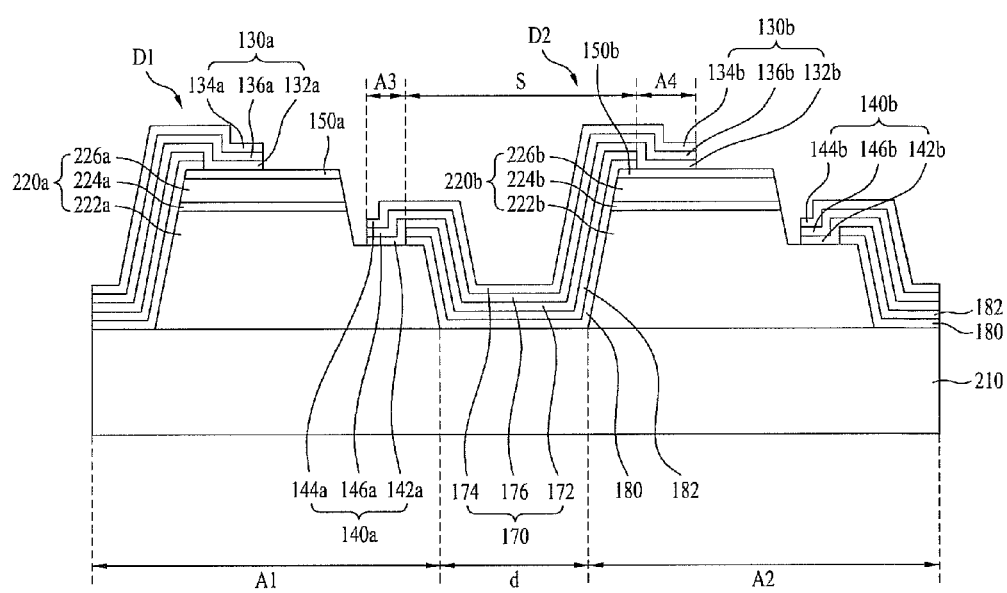
FIG. 4 is a sectional view illustrating a light emitting device array according to another embodiment.

FIG. 4 is a sectional view illustrating a light emitting device array 200B according to another embodiment.

In addition, as exemplarily shown in FIG. 4, the conductive interconnection layer 170 may further a third barrier layer 176 which contacts an upper part of the third adhesive layer 172 and is disposed between the third adhesive layer 172 and the third bonding layer 174. The third barrier layer 174 may be formed to have a single or multilayer structure using at least one of Ni, Cr, Ti, or Pt.

The third barrier layer 176 may have the same material as or material different from the first barrier layer 36 of FIG. 2B.

As such, the conductive interconnection layer 170 may have the same configuration and material as the first electrode layer 30 of FIG. 1, but a thickness of the conductive interconnection layer 170 may be greater than that of the first electrode layer 130b.

In the light emitting device array 200A exemplarily shown in FIG. 3, the first electrode layer 130b, the second electrode layer 140a and the conductive interconnection layer 170 may be separately formed. On the other hand, in the light emitting device array 200B exemplarily shown in FIG. 4, the conductive interconnection layer 170, the first electrode layer 130b and the second electrode layer 140a may be integratedly formed.

In the integrated structure exemplarily shown in FIG. 4, the second electrode layer 140a is disposed in the third region A3 and the first electrode layer 130b is disposed in the fourth region A4. The conductive interconnection layer 170 is disposed in an upper part of the substrate 210 at a boundary area S and electrically connects the second electrode layer 140a to the first electrode layer 130b.

In addition, the light emitting device array 200A of FIG. 3 has one first insulating layer 180, while the light emitting device array 200B of FIG. 4 may further include a second insulating layer 182. The second insulating layer 182 is disposed between the first insulating layer 180 and the plurality of light emitting devices.

Aside from the differences shown in FIGS. 3 and 4, the light emitting device array 200B exemplarily shown in FIG. 4 is the same as the light emitting device array 200A exemplarily shown in FIG. 3 and a detailed explanation thereof is thus omitted.

At least one of the first and second insulating layers 180 or 182 exemplarily shown in FIGS. 3 and 4 may be a distributed Bragg reflector (hereinafter, referred to as a "second distributed Bragg reflector"). The second distributed Bragg reflectors 180 and 182 may efficiently perform the function of the reflective layer, as described with reference to the first distributed Bragg reflectors 60a and 60b. In addition, the second distributed Bragg reflectors 180 and 182 may include an insulating material including first and second layers having different refractive indexes which are alternately laminated two or more times, like the first distributed Bragg reflectors 60a and 60b. The first layer of the second distributed Bragg reflectors 180 and 182 includes a low refractive index layer, for example SiO2 or Al2O3, and the second layer is a high refractive index layer, for example, Si3N4, TiO2, or Si—H. In addition, in the second distributed Bragg reflectors 180 and 182, each of the first and second layers has a thickness of $\lambda/(4n)$.

The material for the second distributed Bragg reflectors 180 and 182 is the same as or different from that of the first distributed Bragg reflectors 60a and 60b, and the configuration (for example, number of lamination) and the thickness thereof may be the same as or different from the first distributed Bragg reflectors 60a and 60b.

Figure 5:
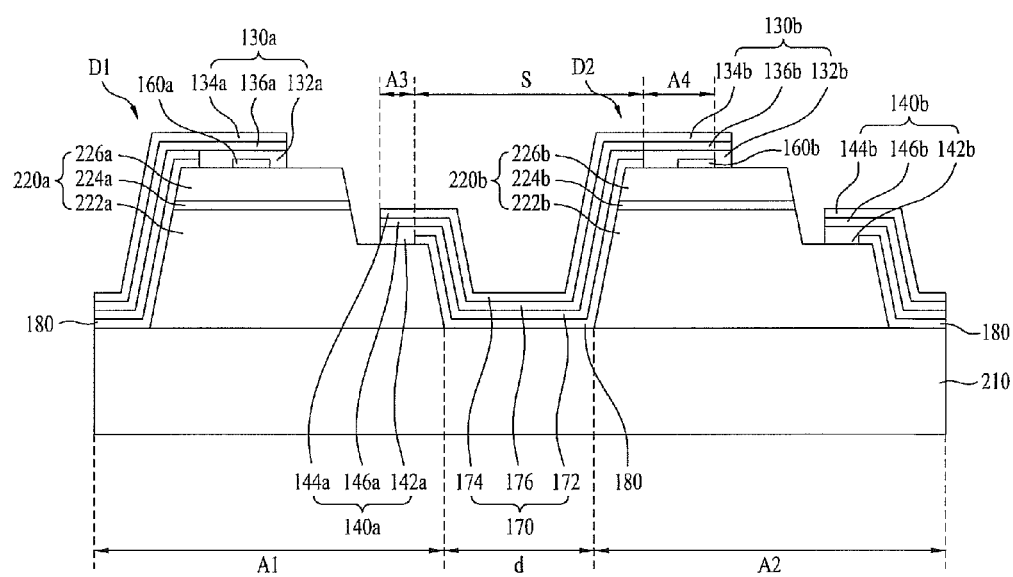
FIG. 5 is a sectional view illustrating a light emitting device array according to still another embodiment.

FIG. 5 is a sectional view illustrating a light emitting device array 200C according to still another embodiment.

Unlike the light emitting device arrays 200A and 200B shown in FIGS. 3 and 4, in the light emitting device array 200C exemplarily shown in FIG. 5, the respective light emitting devices D1 and D2 may further include current blocking layers 160a and 160b spaced in a horizontal direction from the first insulating layer 180 between the upper semiconductor layers 226a and 226b, and the first electrode layers 130a and 130b. In this case, the first electrode layers 130a and 130b may be disposed such that they surround upper and side portions of the current blocking layers 160a and 160b. For example, the first adhesive layers 132a and 132b may be disposed such that they surround upper and side portions of the current blocking layers 160a and 160b. As such, the light emitting device array 200C of FIG. 5 is the same as the light emitting device array 200B of FIG. 4, except that the current blocking layers 160a and 160b are further disposed and the conductive layers 150a and 150b are omitted, and a detailed explanation thereof is thus omitted.

Figure 6:
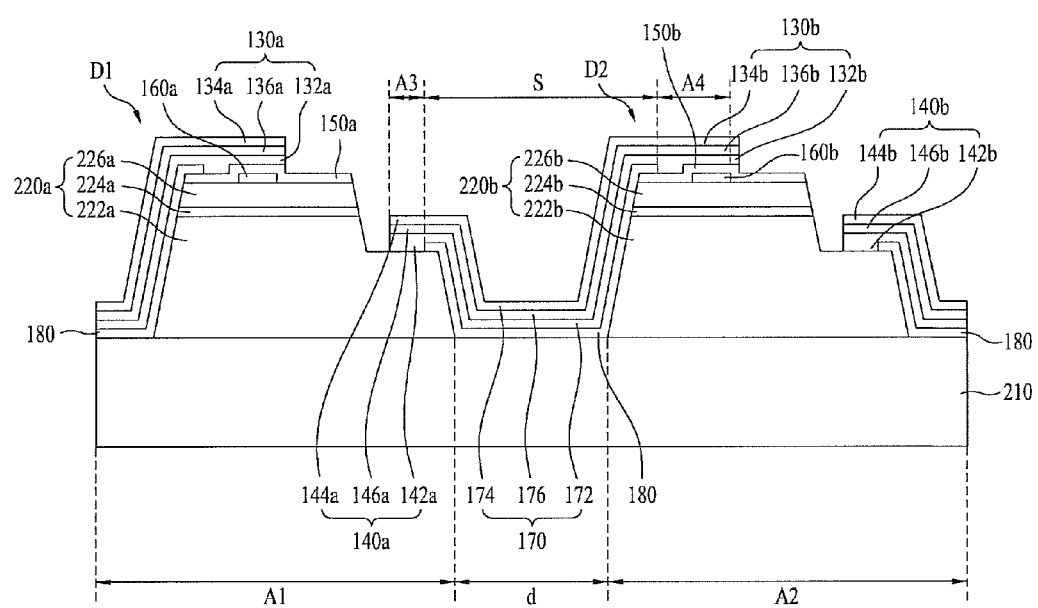
FIG. 6 is a sectional view illustrating a light emitting device array according to still another embodiment.

FIG. 6 is a sectional view illustrating a light emitting device array 200D according to still another embodiment.

As exemplarily shown in FIG. 6, the light emitting device array 200D may further include the conductive layers 150a and 150b between the current blocking layers 160a and 160b and the first electrode layers 130a and 130b. Aside from this feature, the light emitting device array 200D of FIG. 6 is the same as the light emitting device array 200C of FIG. 5 and overlapping features are thus omitted.

The current blocking layers 160a and 160b of FIGS. 5 and 6 may include a distributed Bragg reflector (hereinafter, referred to as a "third distributed Bragg reflector"). The third distributed Bragg reflectors 160a and 160b may function both as the reflective layer and as the current blocking layers, as described above with reference to the first distributed Bragg reflectors 60a and 60b.

The third distributed Bragg reflectors 160a and 160b may include an insulating material including first and second layers having different refractive indexes which are alternately laminated two or more times. The first layer of the third distributed Bragg reflectors 160a and 160b is a low refractive index layer, for example, a SiO2 or Al2O3 layer, and the second layer is a high refractive index layer, for example, a Si3N4, TiO2 or Si—H layer. In addition, in the third distributed Bragg reflectors 160a and 160b, each of the first and second layers has a thickness of $\lambda/(4n)$.

The material of the third distributed Bragg reflectors 160a and 160b may be the same as or different from that of the first distributed Bragg reflector 60a and 60b, or the second distributed Bragg reflectors 180 and 182, and the configuration (for example, number of lamination of first/second layers) and the thickness thereof may be the same as or different from those of the first distributed Bragg reflectors 60a and 60b.

Figure 7:
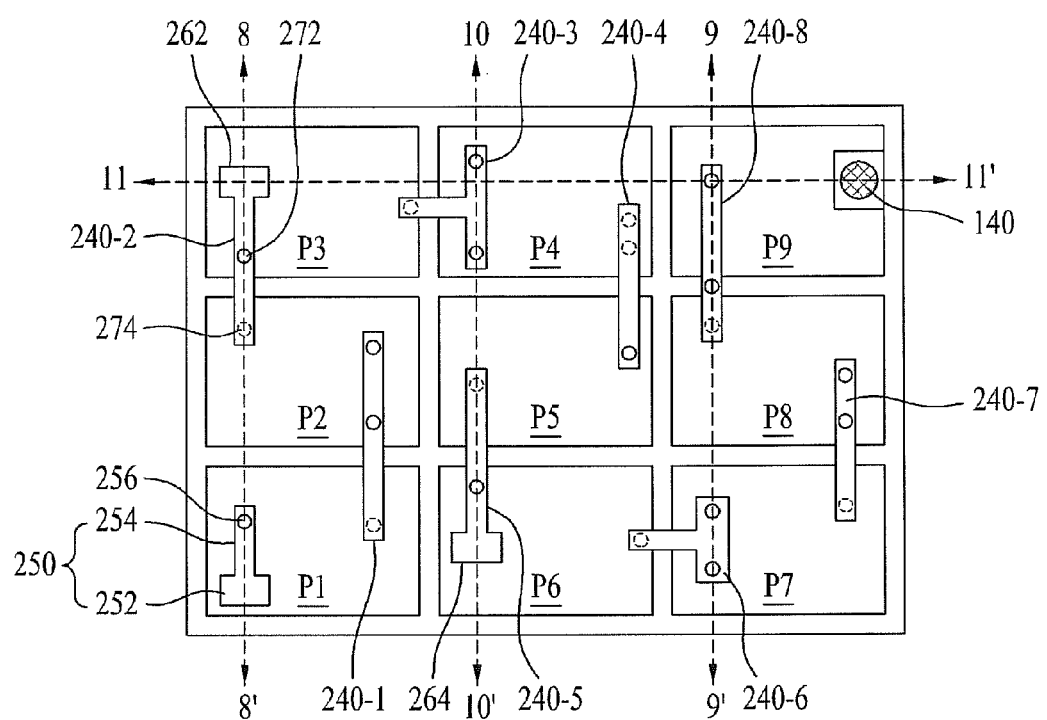
FIG. 7 is a plan view illustrating a light emitting device array according to still another embodiment.
Figure 8:
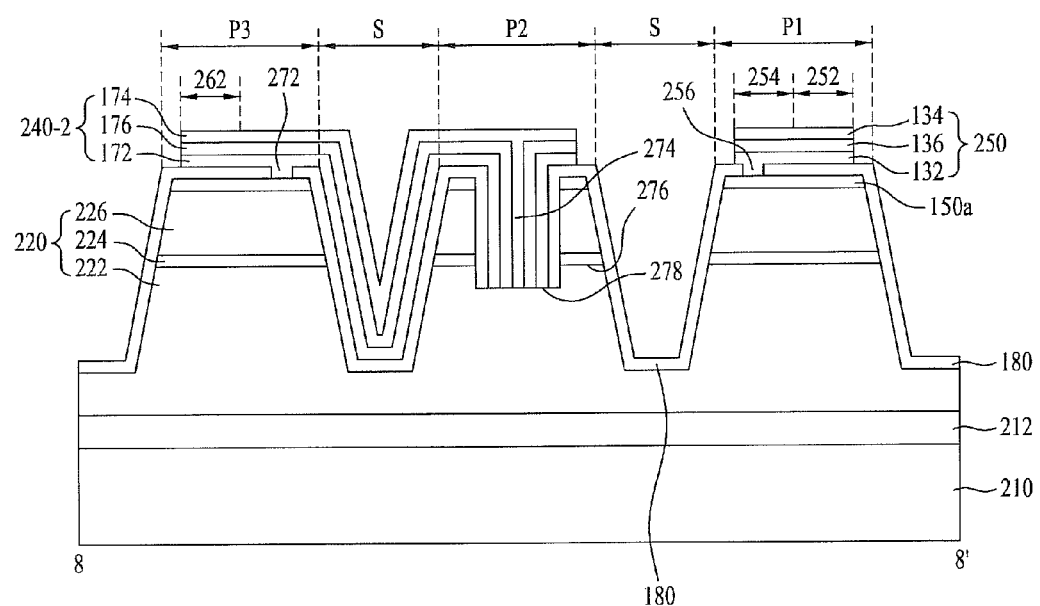
FIG. 8 is a sectional view taken along line 8-8' of the light emitting device array shown in FIG. 7.
Figure 9:
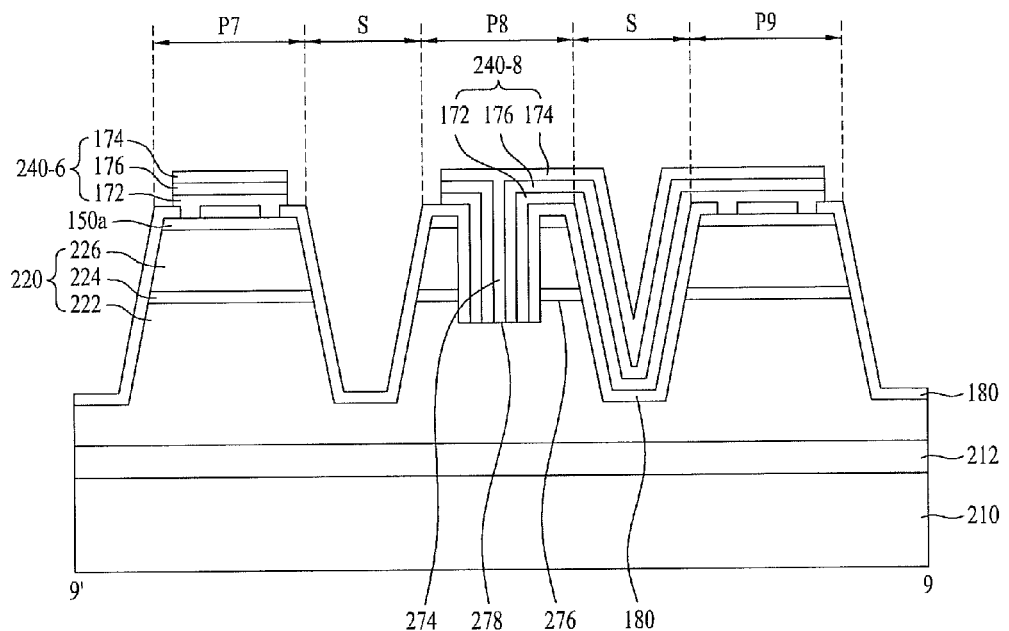
FIG. 9 is a sectional view taken along line 9-9' of the light emitting device array shown in FIG. 7.
Figure 10:
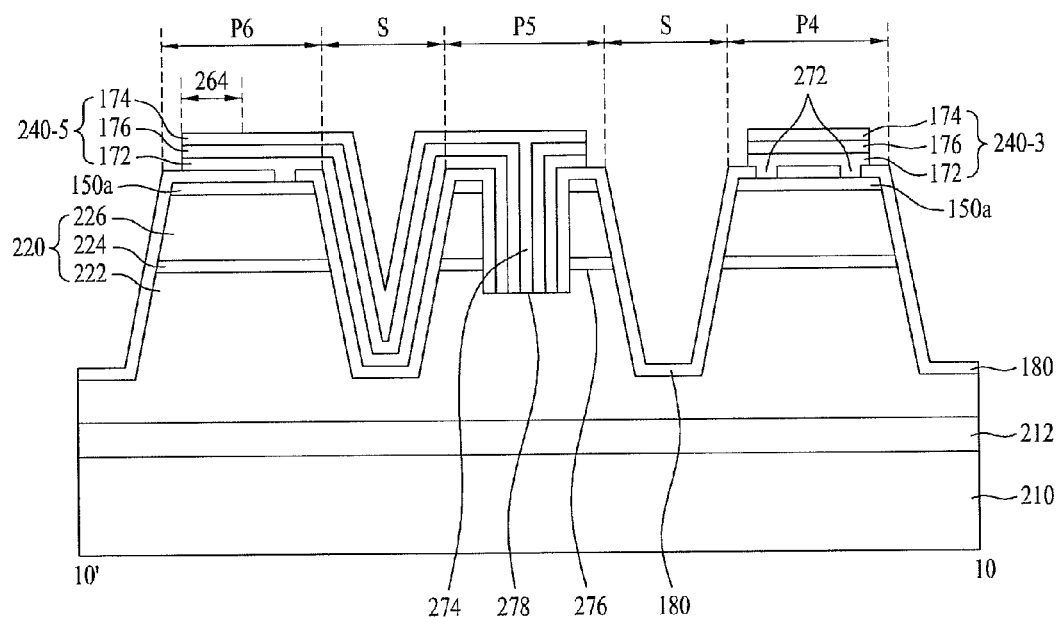
FIG. 10 is a sectional view taken along line 10-10' of the light emitting device array shown in FIG. 7.
Figure 11:
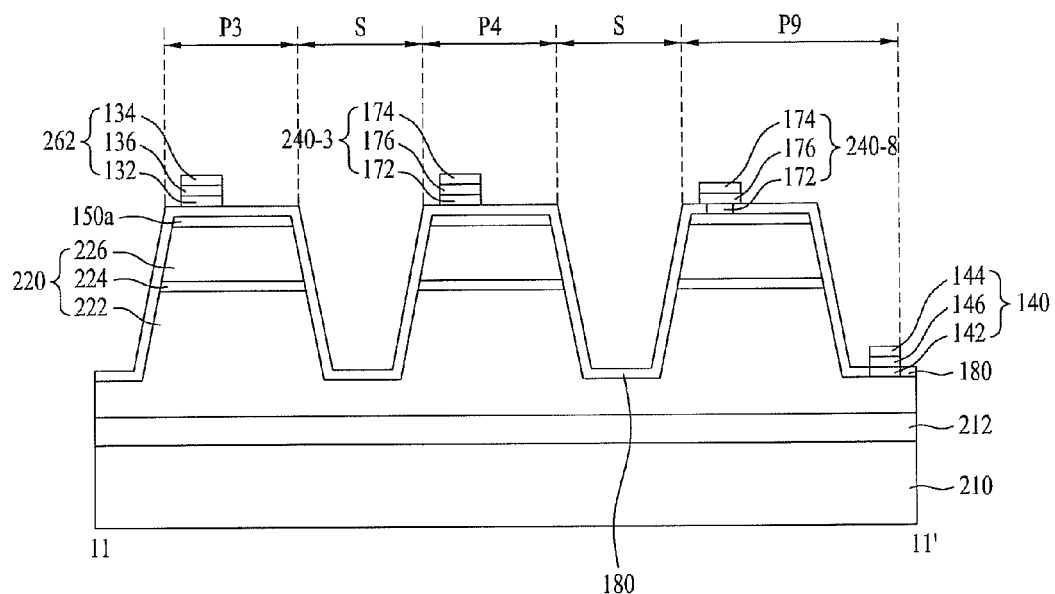
FIG. 11 is a sectional view taken along line 11-11' of the light emitting device array shown in FIG. 7.

FIG. 7 is a plan view illustrating a light emitting device array 200E according to still another embodiment. FIG. 8 is a sectional view taken along line 8-8' of the light emitting device array 200E shown in FIG. 7, FIG. 9 is a sectional view taken along line 9-9' of the light emitting device array 200E shown in FIG. 7, FIG. 10 is a sectional view taken along line 10-10' of the light emitting device array 200E shown in FIG. 7, and FIG. 11 is a sectional view taken along line 11-11' of the light emitting device array 200E shown in FIG. 7.

Referring to FIGS. 7 to 11, the light emitting device array 200E includes a substrate 210, a buffer layer 212, a light emitting structure 220 divided into a plurality of light emitting regions P1 to Pn (n>1, natural number), the conductive layer 150a, the first insulating layer 180, the first electrode layer 250, the conductive interconnection layers 240-1 to 240-m (m≥1, natural number), at least one intermediate pad 262 or 264, and the second electrode layer 140.

The substrate 210, the buffer layer 212 and the light emitting structure 220 correspond to the substrate 10, the buffer layer 12 and the light emitting structure 20 of FIG. 1, respectively, and a detailed explanation thereof is thus omitted.

The lower semiconductor layer 222 may be implemented as an n-type semiconductor layer and the upper semiconductor layer 226 may be implemented as a p-type semiconductor layer. Accordingly, the light emitting structure 220 may include at least one of n-p, p-n, n-p-n, or p-n-p junction structures.

The light emitting structure 220 includes a plurality of light emitting regions P1 to Pn (n>1, natural number) spaced from one another and a plurality of boundary areas (S). Each boundary area S may be disposed between the light emitting regions P1 to Pn (n>1, natural number). Alternatively, the boundary area S may be disposed at a circumference of each of the light emitting regions P1 to Pn (n>1, natural number). The boundary area S may be an exposed portion of the lower semiconductor layer 222 formed by mesa-etching the light emitting structure 220 in order to divide the light emitting structure 220 into the plurality of light emitting regions P1 to Pn (n>1, natural number). Areas of the light emitting regions P1 to Pn (n>1, natural number) may be identical, but the disclosure is not limited thereto.

The light emitting structure 220 in a single chip may be divided into light emitting regions P1 to Pn (n>1, natural number) through the boundary area S.

The conductive layer 150a is disposed on the upper semiconductor layer 226 and is the same as the conductive layer 50a of FIG. 1, and a detailed explanation thereof is thus omitted.

The first insulating layer 180 is the same as the first insulating layer 180 exemplarily shown in FIGS. 3 to 6 and includes the second distributed Bragg reflector as described above. The second distributed Bragg reflector 180 is disposed in the plurality of the light emitting regions P1 to Pn (n>1, natural number) and the boundary area S. For example, the second distributed Bragg reflector 180 may cover upper and side parts of the light emitting regions P1 to Pn (n>1, natural number) and may cover the boundary area S.

The second distributed Bragg reflector 180 reflects light emitted from the light emitting regions P1 to Pn (n>1, natural number). Accordingly, the second distributed Bragg reflector 180 prevents light emitted from the light emitting regions P1 to Pn (n>1, natural number) from being absorbed in the second electrode layer 140, the conductive interconnection layers 240-1 to 240-n (n>1, natural number) and the intermediate pads 262 and 264. For this reason, in the present embodiment, luminous efficacy is improved.

Referring to FIGS. 7 and 8, the first electrode layer 250 is disposed on the upper semiconductor layer 226 in one light emitting region (for example, P1) among the plurality of light emitting regions P1 to Pn (for example, n=9). The first electrode layer 250 may contact the upper semiconductor layer 226 or the conductive layer 150a. For example, the first electrode layer 250 may contact the conductive layer 150a of the first light emitting region (for example, P1) among the light emitting regions connected in serial.

The first electrode layer 250 may include a first pad 252 and a branched finger electrode 254 disposed on the second distributed Bragg reflector 180. A wire (not shown) to supply a first power is bonded to the first pad 252 and the branched finger electrode 254 may have at least one portion 256 which branches from the first pad 252, passes through the second distributed Bragg reflector 180 and contacts the conductive layer 150a. The first junction layer 132, the first barrier layer 136 and the first bonding layer 134 constituting the first electrode layer 250 are the same as the first junction layer 32, the first barrier layer 36 and the first bonding layer 34 shown in FIG. 2B and a detailed explanation thereof is thus omitted. In addition, the first electrode layer 250 may include only the first junction layer 132 and the first bonding layer 134.

Referring to FIGS. 7 and 11, the second electrode layer 140 may be disposed on the lower semiconductor layer 222 in one light emitting region (for example, P9) among the light emitting regions P1 to Pn (for example, n=9) and contact the lower semiconductor layer 222. The second electrode layer 140 may include a second pad bonded to a wire (not shown) to supply a second power. In the embodiment of FIG. 7, the second electrode layer 140 may serve as the second pad. Here, the second junction layer 142, the second barrier layer 146 and the second bonding layer 144 are the same as the first junction layer 32, the first barrier layer 36 and the first bonding layer 34 shown in FIG. 2B, respectively, and a detailed explanation thereof is thus omitted. In addition, the second electrode layer 140 may include only the second junction layer 142 and the second bonding layer 144.

The conductive interconnection layers 240-1 to 240-*m* (for example, m=8) are disposed on the second distributed Bragg reflector 180 and electrically connect the plurality of light emitting regions P1 to Pn (for example, n=9) in serial. For example, the conductive interconnection layers 240-1 to 240-*m* (for example, m=8) connect the plurality of light emitting regions P1 to P9 in serial from the first light emitting region P1 as a starting point, at which the first electrode layer 250 is disposed, to the ninth light emitting region P9 as an end point at which the second electrode layer 140 is disposed.

The conductive interconnection layers 240-1 to 240-*m* include a third adhesive layer 172, a third barrier layer 176 and a third bonding layer 174. Here, the third junction layer 172, the third barrier layer 176 and the third bonding layer 174 are the same as the first junction layer 32, the first barrier layer 36 and the first bonding layer 34 shown in FIG. 2B, respectively, and a detailed explanation thereof is thus omitted. In addition, the conductive interconnection layers 240-1 to 240-*m* may include only the third junction layer 172 and the third bonding layer 174.

Each conductive interconnection layer (for example, 240-1) may electrically connect the lower semiconductor layer 222 of one light emitting region P1 of adjacent light emitting regions (for example, P1 and P2) to the conductive layer 150*a* of the other light emitting region (for example, P2).

In another embodiment, wherein the conductive layer 150*a* is omitted, the conductive interconnection layer (for example, 240-1) may electrically connect the lower semiconductor layer 222 of one light emitting region (for example, P1) to the upper semiconductor layer 226 of the other light emitting region (for example, P2).

The plurality of light emitting regions P1 to Pn (n>1, natural number) connected to one another in serial, included in the light emitting device array 200E are referred to as a first light emitting region to an nth light emitting region, in order. That is, the light emitting region in which the first electrode layer 250 is disposed is referred to as the first light emitting region P1 and the light emitting region at which the second electrode layer 140 is disposed is referred to as an nth light emitting region. Here, the "adjacent light emitting regions" may be a kth light emitting region and a k+1th light emitting region, and the kth conductive interconnection layer may electrically connect the kth light emitting region to the k+1th light emitting region in serial, in which 1≤k≤(n−1).

That is, the kth conductive interconnection layer may electrically connect the lower semiconductor layer 222 of the kth light emitting region to the upper semiconductor layer 226 or the conductive layer 150*a* of the k+1th light emitting region.

For example, referring to FIG. 8, the kth conductive interconnection layer (for example, k=2) may be disposed in the kth light emitting region (for example, k=2), the k+1th light emitting region (for example, k=2) and the boundary area S disposed therebetween. The kth conductive interconnection layer (for example, 240-2) may have at least one first portion (for example, 272) which passes through the second distributed Bragg reflector 180, and contacts the conductive layer 150*a* (or upper semiconductor layer 226) of the k+1th light emitting region (for example, P3). A solid-line circle shown in FIG. 7 represents a first portion 272 of the conductive interconnection layers 240-1 to 240-*m* (for example, m=8).

The second distributed Bragg reflector 180 may be disposed between the light emitting structure 220 and the conductive interconnection layer (for example, 240-2) disposed in the boundary area S.

In addition, the kth conductive interconnection layer (for example, 240-2) may have at least one second portion (for example, 274) which passes through the second distributed Bragg reflector 180, the conductive layer 150*a*, the upper semiconductor layer 226 and the active layer 224 of the kth light emitting region (for example, P2) and contacts the lower semiconductor layer 222. A dotted-line circle shown in FIG. 7 represents a second portion 274 of the conductive interconnection layers 240-1 to 240-*m* (for example, m=8).

The second distributed Bragg reflector 180 is disposed between the kth conductive interconnection layer (for example, 240-2) and the conductive layer 150*a*, between the second portion 274 of the kth conductive interconnection layer (for example, 240-2) and the upper semiconductor layer 226, and between the second portion 274 of the kth conductive interconnection layer (for example, 240-2) and the active layer 224, and electrically isolate these layers from one another. That is, the second distributed Bragg reflector 180 may serve to electrically isolate the conductive layer 150*a*, the upper semiconductor layer 226 and the active layer 224 of the kth light emitting region (for example, P2) from the kth conductive interconnection layer (for example, 240-2).

In the case of the light emitting device array 200A to 200D exemplarily shown in FIGS. 3 to 6, in order to form the second electrode layer 140 connected to the lower semiconductor layer 222, mesa-etching to expose the lower semiconductor layer 222 by etching the light emitting structure 220 is performed. In general, the light emitting region of the light emitting device decreases in proportion to the mesa-etched portion.

However, in the light emitting device array exemplarily shown in FIGS. 7 to 11, the second portion (for example, 274) of the kth conductive interconnection layer (for example, 240-2) may have a hole or groove filled with an electrode material and, for this reason, the amount of the light emitting region lost by the mesa-etching is decreased and, in the present embodiment, the light emitting area is thus increased.

Referring to FIG. 8, a lower surface 278 of the second portion 274 in the kth conductive interconnection layer (for example, 240-2) may be disposed lower than a lower surface 276 of the active layer 224.

Referring to FIGS. 7, 8 and 10, the intermediate pad 262 or 264 is disposed on the second distributed Bragg reflector 180 in the at least one light emitting region among the light emitting regions P1 to Pn (n>1, natural number) and is electrically connected to the upper semiconductor layer 226 or the conductive layer 150*a*. The intermediate pad 262 or 264 may provide an area to which a wire is bonded so as to supply first power.

For example, the intermediate pad 262 or 264 may be disposed on the second distributed Bragg reflector 180 in at least one light emitting region (for example, at least one of P3 or P6), excluding the light emitting regions (for example, P1 and P9) in which the first electrode layer 250 and the second electrode layer 140 are disposed, among the light emitting regions (for example, P2 to P8).

The second distributed Bragg reflector 180 is disposed between the intermediate pad 262 or 264, and the conductive layer 150*a*, the intermediate pad 262 is connected to the conductive interconnection layer (for example, 240-2) disposed in the same light emitting region (for example, P3), and the intermediate pad 264 may be connected to the conductive interconnection layer (for example, 240-5) disposed in the same light emitting region (for example, P6).

However, in another embodiment, a portion of the intermediate pad may pass through the second distributed Bragg reflector 180 and be directly connected to the conductive layer 150*a*. In this case, the intermediate pad and the conductive interconnection layer disposed in the same light emitting region may or may not be connected to each other.

Figure 12:
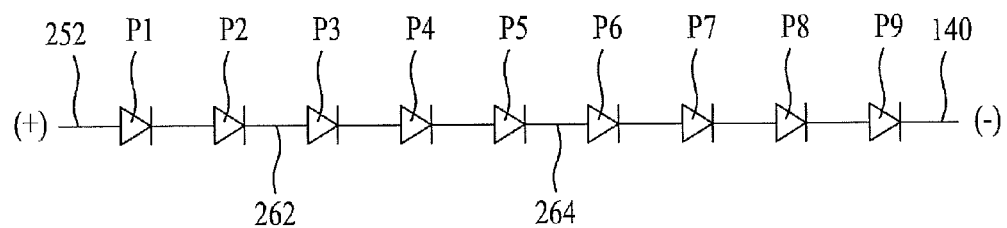
FIG. 12 is a circuit diagram illustrating the light emitting device array shown in FIG. 7.

FIG. 12 is a circuit diagram illustrating the light emitting device array 200E shown in FIG. 7. Referring to FIGS. 7 and 12, the light emitting device array 200E may have a common (−) terminal, for example, one second pad 140, may have two or more (+) terminals, for example, the first pad 252 and at least one of intermediate pad 262 or 264.

Accordingly, the light emitting device array 200E includes the plurality of (+) terminals pads 252, 262 and 264, thus enabling use of various driving voltages and light emission at various brightnesses. For example, when a driving voltage to drive one light emitting region is 3.4V, in the case in which the driving voltage applied to the light emitting device array 200E is 23.8V, the third to ninth light emitting regions P3 to P9 can be driven by supplying a first power to the first intermediate pad 262.

In addition, when the driving voltage applied to the light emitting device array 200E is 13.6V, sixth to ninth light emitting regions P6 to P9 can be driven by supplying the first power to the second intermediate pad 264.

In addition, when the driving voltage applied to the light emitting device array 200E is 30.6V, the first to ninth light emitting regions P1 to P9 can be driven by supplying first power to the first pad 252.

As such, in the embodiments, the array may be designed so as to drive the part or the entirety of the light emitting regions according to applied driving voltage by supplying the first power to one of the intermediate pad 262 or 264, and the first pad 252.

In addition, when the driving voltage is a high voltage, the light emitting regions may be provided as the number corresponding to the high voltage. For example, when the driving voltage to drive one light emitting region is 4 volts and the driving voltage applied to the light emitting device array 200E is 200V, the array may be designed so that 50 (n=50) light emitting regions are provided.

In addition, the conductive interconnection layers 240-1 to 240-*m* (m≥1, natural number) point-contact the conductive layer 150*a* or the lower semiconductor layer 222, thus increasing a light emitting area, distributing current and thereby improving luminous efficacy.

The second distributed Bragg reflector 180 prevents absorption and loss of light in the first electrode layer 250, the conductive interconnection layers 240-1 to 240-*n* (n>1, natural number) and the intermediate pad 262 or 264, thereby improving luminous efficacy in the embodiment.

Figure 13:
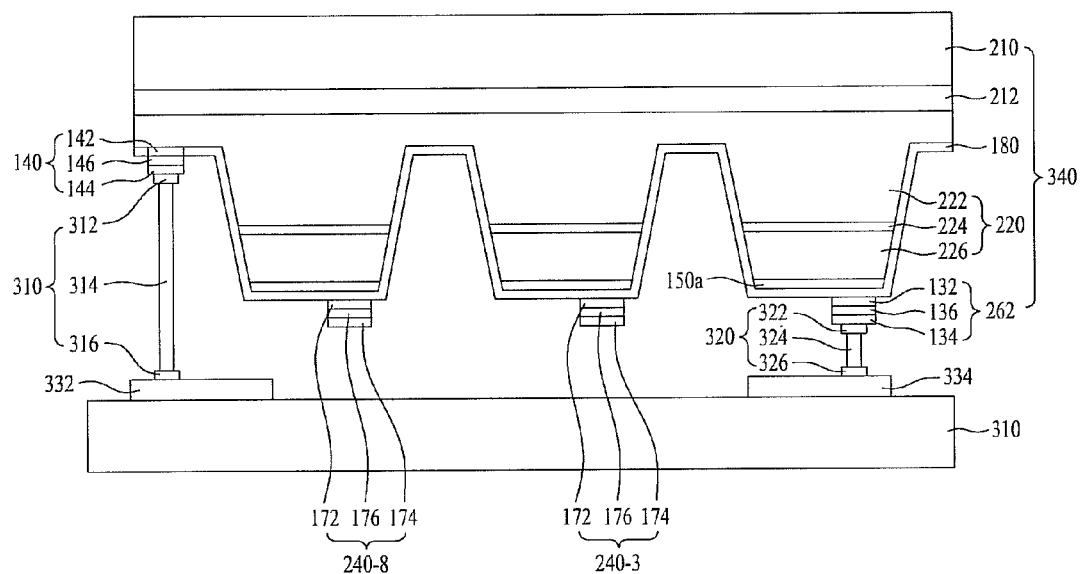
FIG. 13 is a sectional view illustrating a light emitting device array including the light emitting device according to still another embodiment.

FIG. 13 is a sectional view illustrating a light emitting device array 200F including the light emitting device according to still another embodiment.

Referring to FIG. 13, the light emitting device array 200F includes a submount 310, a first metal layer 332, a second metal layer 334, a first bump unit 310 and a second bump unit 320, and a light emitting device array 340.

The light emitting device array of FIG. 13 is an example in which the light emitting device array 200E shown in FIG. 7 is implemented in a flip-chip form, although embodiments are not limited thereto. In other embodiments, the light emitting device arrays 200A to 200D may be implemented in flip-chip form as shown in FIG. 13.

The light emitting device 340 mounts the submount 310. The submount 310 may be implemented by a package body, a printed circuit board or the like, and may have various shapes enabling flip-chip bonding of the light emitting device 340.

The light emitting device array 340 is disposed on the submount 310 and is electrically connected to the submount 310 via the first bump unit 310 and the second bump unit 320. The light emitting device array 340 shown in FIG. 13 has the same cross-section as the light emitting device array 200E shown in FIG. 11. Accordingly, the same elements are not repeatedly described.

The submount 310 may be include a resin such as polyphthalamide (PPA), a liquid crystal polymer (LCP) or polyamide9T (PA9T), a metal, photo-sensitive glass, sapphire, a ceramic, a printed circuit board or the like. However, the material for the submount 310 according to the present embodiment is not limited thereto.

The first metal layer 332 and the second metal layer 334 are spaced from each other in a horizontal direction on the submount 310. The upper surface of the submount 310 may face the light emitting device array 340. The first metal layer 332 and the second metal layer 334 may be composed of a conductive metal, for example, aluminum (Al) or rhodium (Rh).

The first bump unit 310 and the second bump unit 320 are disposed between the submount 310 and the light emitting device array 340. The first bump unit 310 electrically connects the second electrode layer 140 to the first metal layer 332.

The second bump unit 320 may electrically connect any one of the first electrode layer 250 and the intermediate pad 262 or 264 to the second metal layer 334.

The first bump unit 310 includes a first anti-diffusion adhesive layer 312, a first bumper 314 and a second anti-diffusion adhesive layer 316. The first bumper 314 is disposed between the second electrode layer 140 and the first metal layer 332. The first anti-diffusion adhesive layer 312 is disposed between the second electrode layer 140 and the first bumper 314 and junctions the first bumper 314 to the second electrode layer 140. That is, the first anti-diffusion adhesive layer 312 improves an adhesive strength between the first bumper 314 and the second electrode layer 140 and prevents permeation or diffusion of ions contained in the first bumper 314 through the second electrode layer 140 into the light emitting structure 220.

The second anti-diffusion adhesive layer 316 is disposed between the first bumper 314 and the first metal layer 332 and junctions the first bumper 314 to the first metal layer 332. The second anti-diffusion adhesive layer 316 improves adhesive strength between the first bumper 314 and the first metal layer 332 and prevents permeation or diffusion of ions contained in the first bumper 314 through the first metal layer 332 into the submount 310.

The second bump unit 320 includes a third anti-diffusion adhesive layer 322, a second bumper 324, and a fourth anti-diffusion adhesive layer 326. The second bumper 324 is disposed between one of the first electrode layer 250 and the intermediate pad 262 or 264, and the second metal layer 334.

The third anti-diffusion adhesive layer 322 is disposed between any one of the first electrode layer 250 and the intermediate pad 262 or 264, and the second bumper 324, and junctions the two elements. That is, the third anti-diffusion adhesive layer 322 improves adhesive strength and prevents permeation or diffusion of ions contained in the second bumper 324 through the first electrode layer 250 or intermediate pad 262 or 264 into the light emitting structure 220.

The fourth anti-diffusion adhesive layer 326 is disposed between the second bumper 324 and the second metal layer 334, and junctions the second bumper 324 to the second metal layer 334. The fourth anti-diffusion adhesive layer 326 improves adhesive strength between the second bumper 324 and the second metal layer 334, and prevents permeation or diffusion of ions contained in the second bumper 324 into the submount 310 through the second metal layer 334.

The first to fourth anti-diffusion adhesive layers 312, 316, 322 and 326 may contain at least one of Pt, Ti, W/Ti, or Au, or an alloy thereof. In addition, the first bump 314 and the second bump 324 may contain at least one of titanium (Ti), copper (Cu), nickel (Ni), gold (Au), chromium (Cr), tantalum (Ta), platinum (Pt), or tin (Sn).

In the embodiments, absorption and loss of light in the first electrode layer 250, the conductive interconnection layers 240-1 to 240-$n$ ($n>1$, natural number) and the intermediate pad 262 or 264 are prevented through the second distributed Bragg reflector 180, thereby improving luminous efficacy.

In the electrode layer and the conductive interconnection layer of the light emitting device and the light emitting device array including the same according to the embodiments, a reflective layer is not interposed between the bonding layer and the adhesive layer, so that the adhesive layer can be formed to a great thickness. Therefore, adhesive strength between the electrode layer and the light emitting structure may be improved and adhesive strength between the conductive interconnection layer and the insulating layer may be enhanced, thereby solving problems such as product defects and decrease in yield due to a conventional thin adhesive layer, allowing the distributed Bragg reflector disposed instead of the insulating layer to serve as the reflective layer and thereby improving luminous efficacy.

An array of plural light emitting device packages including the light emitting device or the light emitting device array according to the embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a backlight unit.

In accordance with other embodiments, the light emitting device package including the light emitting device or the light emitting device array may be implemented for a display device, an indicating device and a lighting system, for example, the lighting system may include a lamp or a streetlight.

Figure 14:
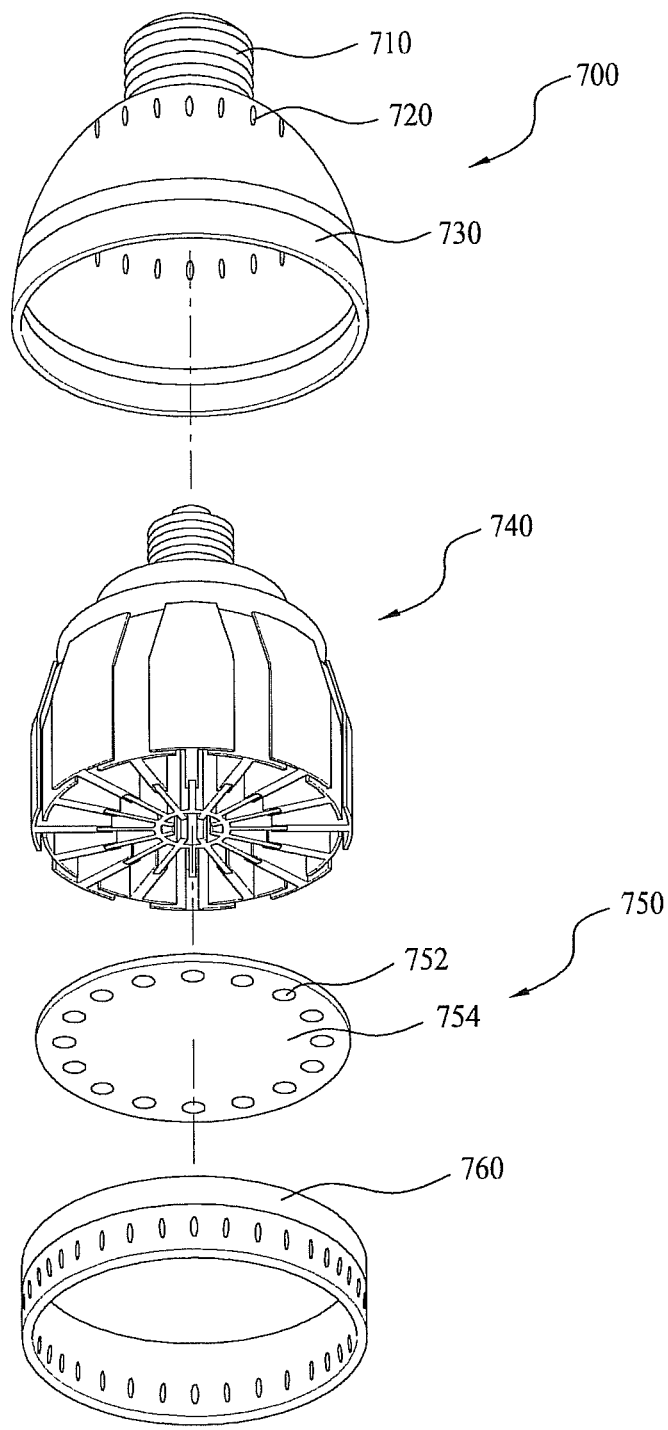
FIG. 14 is an exploded perspective view illustrating a lighting device including a light emitting device package according to an embodiment.

FIG. 14 is an exploded perspective view illustrating a lighting device including the light emitting device package according to the embodiment. Referring to FIG. 14, the lighting device includes a light source 750 to emit light, a housing 700 including the light source 750, a radiator 740 to emit heat of the light source 750, and a holder 760 to connect the light source 750 and the radiator 740 to the housing 700.

The housing 700 includes a socket connector 710 connected to an electric socket (not shown) and a body member 730 connected to the socket connector 710 wherein the body member 730 includes a light source 750. The body member 730 may be provided with an air passage hole 720.

The body member 730 of the housing 700 is provided on the surface thereof with one or a plurality of air passage holes 720. The air passage holes 720 may be radially arranged in the body member 730 or be disposed in various arrangements.

The light source 750 includes a plurality of the light emitting device packages 752 arranged on a substrate 754. The substrate 754 has a shape enabling insertion into an opening of the housing 700 and is made of a material having high thermal conductivity to transfer heat to the radiator 740 as described below. The light emitting device packages may include the light emitting device or the light emitting device array according to the afore-mentioned embodiment.

The holder 760 is provided under the light source 750 and may include a frame and another air passage hole. In addition, although not shown, optical members are provided under the light source 750 to diffuse, scatter or converge light emitted from the light emitting device package 752 of the light source 750.

Figure 15:
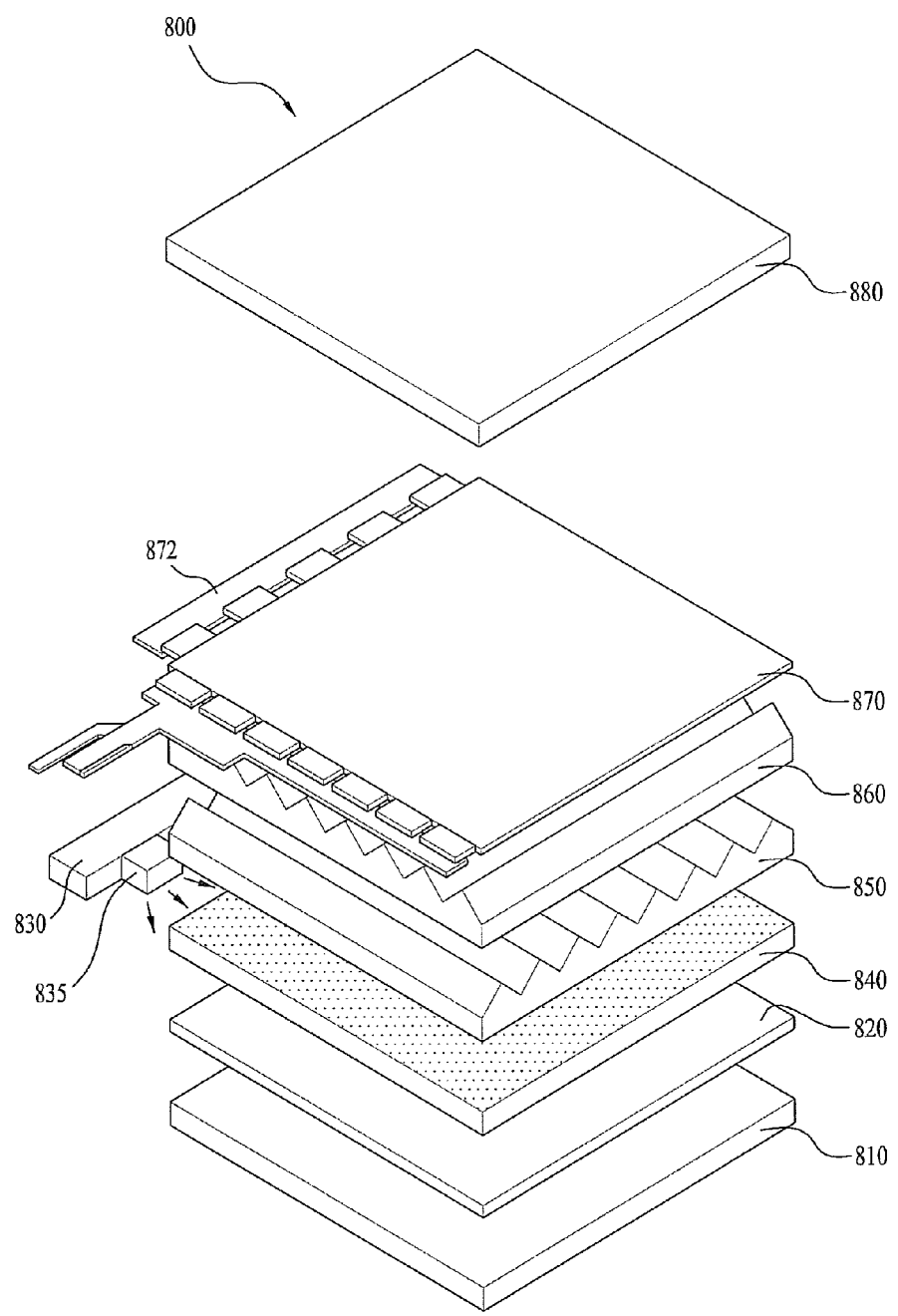
FIG. 15 is a view illustrating a display device including a light emitting device package according to an embodiment.

FIG. 15 is a view illustrating a display device including the light emitting device package according to one embodiment.

Referring to FIG. 15, the display device 800 according to this embodiment includes a bottom cover 810, a reflective plate 820 disposed on the bottom cover 810, light source modules 830 and 835 to emit light, a light guide plate 840 arranged in front of the reflective plate 820 and guiding light emitted the light source module toward the front of the display device, an optical sheet including a first prism sheet 850 and a second prism sheet 860 arranged in front of the light guide plate 840, a display panel 870 arranged in front of the optical sheet, an image signal output circuit 872 connected to the display penal 870 and supplying an image signal to the display panel 870, and a color filter 880 arranged in front of the display panel 870. The bottom cover 810, the reflective plate 820, the light source modules 830 and 835, the light guide plate 840 and the optical sheet may constitute a backlight unit.

The light source module includes a light emitting device package 835 mounted on the substrate 830. The substrate 830 may be a PCB or the like. The light emitting device package 835 may be the same as the light emitting device or the light emitting device array according to the embodiment.

The bottom cover 810 may accommodate constituent components of the display device 800. The reflective plate 820 may be provided as a separate element, as illustrated in the drawing, or as a coating having a high reflectivity provided on the rear surface of the light guide plate 840 or the front surface of the bottom cover 810.

Here, the reflective plate 820 may be made of a highly reflective material which may have an ultrathin structure and examples thereof include polyethylene terephthalate (PET).

In addition, the light guide plate 840 is made of polymethylmethacrylate (PMMA), polycarbonate (PC) or polyethylene (PE).

The first prism sheet 850 is formed at one side of a support film using a light-transmitting and elastic polymer and the polymer may include a prism layer having a plurality of repeatedly formed three-dimensional structures. Here, the plurality of patterns, as illustrated in the drawing, may be provided as stripe patterns in which ridges and valleys repeatedly alternate.

A direction of the ridges and valleys arranged on one side of the support film in the second prism sheet 860 may be vertical to a direction of ridges and valleys arranged on one side of the support film in the first prism sheet 850 so that light transferred from the light source module and the reflective sheet can be uniformly distributed in all directions of the display panel 870.

Although not shown, a diffusion sheet may be disposed between the light guide plate 840 and the first prism sheet 850. The diffusion sheet may be made of a polyester or polycarbonate-based material and maximize light projection angle by refracting and scattering light emitted from the backlight unit. In addition, the diffusion sheet includes a support layer containing a light diffusion agent and a first layer and a second layer which are formed on a light-emission surface (first prism sheet direction) and a light incidence surface (reflective sheet direction), respectively, and contain no light diffusion agent.

In the present embodiment, the first prism sheet 850 and the second prism sheet 860 constitute an optical sheet and the optical sheet may be provided as another combination, for example, a micro lens array, a combination of a diffusion sheet and a micro lens array, or a combination of a prism sheet and a micro lens array.

The display panel 870 may be provided with a liquid crystal panel and the liquid crystal panel as well as other display devices requiring a light source may be provided.

Embodiments provide a light emitting device to improve yield and provide enhanced luminous efficacy, and a light emitting device array including the same.

In one embodiment, a light emitting device includes a substrate, a light emitting structure including lower and upper semiconductor layers having different conductive types, and an active layer disposed between the lower and upper semiconductor layers, the light emitting structure being disposed on the substrate, and a first electrode layer disposed on the upper semiconductor layer, wherein the first electrode layer includes a first adhesive layer and a first bonding layer overlapping each other, wherein a reflective layer is not disposed between the first adhesive layer and the first bonding layer. The first electrode layer may further include a first barrier layer disposed on the first adhesive layer such that the first barrier layer contacts the first adhesive layer.

The light emitting device may further include a second electrode layer disposed on the lower semiconductor layer, wherein the second electrode layer includes a second adhesive layer and a second bonding layer overlapping each other, wherein a reflective layer is not disposed between the second adhesive layer and the second bonding layer. The second electrode layer may further include a second barrier layer disposed on the second adhesive layer such that the second barrier layer contacts the second adhesive layer.

The first or second adhesive layer may include at least one of Cr, Rd, or Ti. The first barrier layer may include at least one of Ni, Cr, Ti, or Pt. The first adhesive layer may have a thickness of at least 2 nm to 15 nm. A side surface of the lower semiconductor layer may be inclined.

The light emitting layer may further include a conductive layer disposed between the upper semiconductor layer and the first electrode layer and may further include a current blocking layer disposed between the conductive layer and the upper semiconductor layer. The conductive layer may be disposed to surround upper and side parts of the current blocking layer.

The current blocking layer may be a distributed Bragg reflector. The distributed Bragg reflector may include an insulating material including two or more first and second layers having different refractive indexes which are alternately laminated two or more times. The first electrode layer may have a width of 5 μm to 100 μm.

The first bonding layer may have a thickness of 100 nm to 2,000 nm.

In another embodiment, a light emitting device array includes a substrate, a plurality of light emitting devices spaced from one another in a horizontal direction on the substrate, a conductive interconnection layer to connect the two light emitting devices among the plurality of light emitting devices, and a first insulating layer disposed between the light emitting devices and the conductive interconnection layer, wherein respective light emitting devices include a light emitting structure including lower and upper semiconductor layers having different conductive types, and an active layer disposed between the lower and upper semiconductor layers, a first electrode layer disposed on the upper semiconductor layer, and a second electrode layer disposed on the lower semiconductor layer, wherein the conductive interconnection layer connects the first electrode layer of one of the two light emitting devices to the second electrode layer of the other of the two light emitting devices, wherein the first electrode layer includes a first adhesive layer and a first bonding layer overlapping each other, wherein a reflective layer is not disposed between the first adhesive layer and the first bonding layer.

The second electrode layer includes a second adhesive layer and a second bonding layer overlapping each other, wherein a reflective layer is not disposed between the second adhesive layer and the second bonding layer. The second electrode layer may further include a second barrier layer disposed on the second adhesive layer such that the second barrier layer contacts the second adhesive layer.

The conductive interconnection layer may include a third adhesive layer and a third bonding layer overlapping each other, wherein a reflective layer is not disposed between the third adhesive layer and the third bonding layer.

The conductive interconnection layer may further include a third barrier layer on the third adhesive layer such that the third barrier layer contacts the third adhesive layer.

The first, second or third adhesive layer may include at least one of Cr, Rd, or Ti. The first, second or third barrier layer may include at least one of Ni, Cr, Ti, or Pt. The first, second or third adhesive layer may have a thickness of at least 5 nm to 15 nm.

The light emitting device array may further include a second insulating layer disposed between the first insulating layer and the light emitting devices.

At least one of the first and second insulating layers may be a distributed Bragg reflector.

The first and second electrode layers of the two light emitting devices connected through the conductive interconnection layer, and the conductive interconnection layer may be integrated with one another.

A thickness of the conductive interconnection layer may be greater than that of the first electrode layer. Each light emitting device may further include a conductive layer disposed between the upper semiconductor layer and the first electrode layer.

Each light emitting device may further include a current blocking layer spaced from the first insulating layer between the light emitting structure and the first electrode layer.

The first conductive layer may be disposed to surround upper and side parts of the current blocking layer and the current blocking layer may be a distributed Bragg reflector.

The first electrode layer may have a width of 5 μm to 100 μm.

The light emitting devices may be connected in serial through the conductive interconnection layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device array, comprising:
a substrate;
a plurality of light emitting devices spaced from one another in a horizontal direction on the substrate;
a conductive interconnection layer to connect two light emitting devices among the plurality of light emitting devices; and
a first insulating layer disposed between the light emitting devices and the conductive interconnection layer,
wherein respective light emitting devices comprise:
a light emitting structure including lower and upper semiconductor layers having different conductive types, and an active layer disposed between the lower and upper semiconductor layers;
a first electrode disposed on the upper semiconductor layer;
a second electrode disposed on the lower semiconductor layer; and
a current blocking layer disposed between the light emitting structure and the first electrode,
wherein the conductive interconnection layer connects the first electrode of one of the two light emitting devices to the second electrode of the other of the two light emitting devices,
wherein the first electrode includes a first adhesive layer and a first bonding layer overlapping each other,
wherein a reflective layer is not disposed between the first adhesive layer and the first bonding layer,
wherein the first adhesive layer is disposed to surround upper and side parts of the current blocking layer,
wherein the conductive interconnection layer comprises a third adhesive layer and a third bonding layer overlapping each other, and
wherein a reflective layer is not disposed between the third adhesive layer and the third bonding layer.

2. The light emitting device array according to claim 1, wherein the conductive interconnection layer further comprises a third barrier layer on the third adhesive layer and contacting the third adhesive layer.

3. The light emitting device array according to claim 1, further comprising a second insulating layer disposed between the first insulating layer and the light emitting devices.

4. The light emitting device array according to claim 3, wherein at least one of the first insulating layer or second insulating layer is a distributed Bragg reflector.

5. The light emitting device array according to claim 1, wherein the first and second electrode of the two light emitting devices connected through the conductive interconnection layer and the conductive interconnection layer are integrated with one another.

6. The light emitting device array according to claim 1, wherein each light emitting device further comprises a conductive layer disposed between the upper semiconductor layer and the first electrode.

7. The light emitting device array according to claim 6, wherein the conductive interconnection layer point-contacts the conductive layer or the lower semiconductor layer.

8. The light emitting device array according to claim 6, wherein the current blocking layer is spaced from the first insulating layer between the light emitting structure and the first electrode.

9. The light emitting device array according to claim 1, wherein a thickness of the conductive interconnection layer is greater than that of the first electrode.

10. The light emitting device array according to claim 1, wherein the current blocking layer includes a distributed Bragg Reflector.

* * * * *